US006583010B2

(12) United States Patent
Mo

(10) Patent No.: US 6,583,010 B2
(45) Date of Patent: Jun. 24, 2003

(54) TRENCH TRANSISTOR WITH SELF-ALIGNED SOURCE

(75) Inventor: Brian Sze-Ki Mo, Stanford, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/839,523

(22) Filed: Apr. 20, 2001

(65) Prior Publication Data
US 2001/0028084 A1 Oct. 11, 2001

Related U.S. Application Data

(62) Division of application No. 09/282,274, filed on Mar. 31, 1999, now Pat. No. 6,316,806.

(51) Int. Cl.[7] .............................................. H01L 21/336
(52) U.S. Cl. ...................... 438/270; 438/514; 438/525; 438/527
(58) Field of Search ................................ 438/270, 514, 438/525, 527

(56) References Cited

U.S. PATENT DOCUMENTS

| 4,415,371 | A | | 11/1983 | Soclof |
| 4,756,793 | A | * | 7/1988 | Peek |
| 4,889,827 | A | | 12/1989 | Willer |
| 5,278,438 | A | * | 1/1994 | Kim et al. ................ 257/316 |
| 5,298,780 | A | | 3/1994 | Harada |
| 5,439,839 | A | | 8/1995 | Jang |
| 5,488,010 | A | * | 1/1996 | Wong |
| 5,498,564 | A | * | 3/1996 | Geissler et al. |
| 5,567,634 | A | | 10/1996 | Hebert et al. |
| 5,571,738 | A | | 11/1996 | Krivokapic |
| 5,592,005 | A | | 1/1997 | Floyd et al. |
| 5,610,422 | A | | 3/1997 | Yanagiya et al. |
| 5,635,749 | A | | 6/1997 | Hong |
| 5,665,619 | A | | 9/1997 | Kwan et al. |
| 5,684,319 | A | | 11/1997 | Hebert |
| 5,701,026 | A | | 12/1997 | Fujishima et al. |
| 5,970,344 | A | | 10/1999 | Kubo et al. |
| 6,051,468 | A | * | 4/2000 | Hshieh .................... 438/270 |
| 6,265,748 | B1 | * | 7/2001 | Hoffmann et al. .......... 257/390 |
| 6,274,437 | B1 | * | 8/2001 | Evans ...................... 438/272 |
| 6,297,101 | B1 | * | 10/2001 | Schaeffer ................. 438/268 |
| 6,307,246 | B1 | * | 10/2001 | Nitta et al. ............... 257/493 |
| 6,316,806 | B1 | * | 11/2001 | Mo ......................... 257/330 |
| 6,362,040 | B1 | * | 3/2002 | Tews et al. ............... 438/246 |
| 6,376,314 | B1 | | 4/2002 | Jerred |

FOREIGN PATENT DOCUMENTS

DE          019908809 A1  *  3/1999

* cited by examiner

Primary Examiner—Long Pham
(74) Attorney, Agent, or Firm—Townsend and Townsend and Crew LLP

(57) ABSTRACT

A trench field-effect transistor with a self-aligned source. At least a portion of the source implantation dose (604) is implanted underneath the gate (610) of a trench transistor by implanting an a non-orthogonal angle to the sidewall (608) of the trench. In one embodiment, a slow diffuser, such as arsenic, is implanted to minimize the post-implant diffusion. The resulting structure ensures gate-source overlap, and a consistent, small, gate-source capacitance with a lower thermal budget for the resultant device. The narrow depth of the source, in conjunction with its unique L-shape, improves device ruggedness because the source doping does not compensate the heavy body doping as much as with conventional devices. In one embodiment, the substrate is rotated 90 degrees within the implanter to implant both sidewalls of a trench.

14 Claims, 5 Drawing Sheets

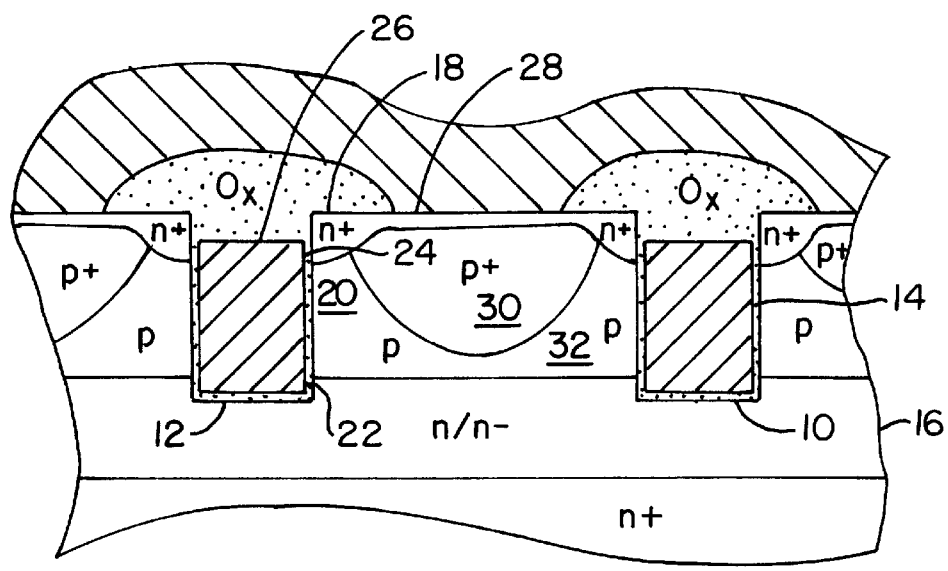
FIG. 1 PRIOR ART
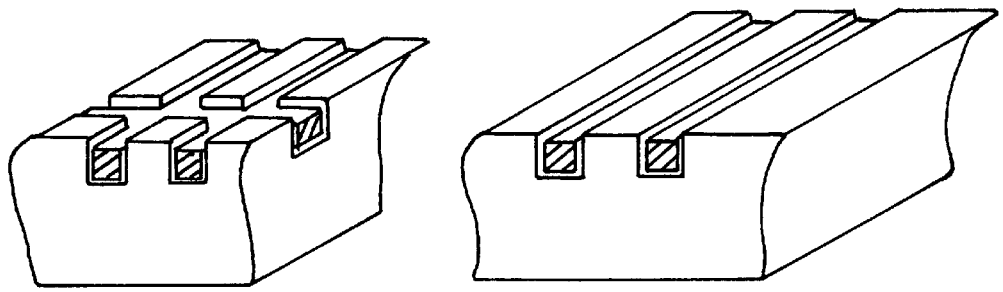
FIG. 2 PRIOR ART     FIG. 3 PRIOR ART

TRENCH TRANSISTOR WITH SELF-ALIGNED SOURCE

This application is a division of and claims the benefit of U.S. application Ser. No. 09/282,274, filed Mar. 31, 1999 now U.S. Pat. No. 6,316,806.

BACKGROUND OF THE INVENTION

The present invention relates in general to field effect transistors, and in particular to trench metal-oxide semiconductor field-effect transistors ("MOSFETs"), and methods of their manufacture.

FIG. 1 is a simplified cross section of a portion of a typical trench MOSFET. A trench 10 is lined with an electrically insulating material 12 and filled with a conductive material 14, which forms the gate. The trench, and hence the gate, extend into a drain region 16 (in this case an n-type region for an n-channel device), which may be electrically contacted through the substrate of the device. A source region 18 opposite the drain region forms an active region 20 adjacent the gate, between the source and drain.

The gate conductive material may be doped polysilicon or the like, and forms an overlap 22 with the drain and another overlap 24 with the source. The overlaps ensure that the active region turns on when voltage is applied to the gate. In conventional devices, the overlap is achieved by implanting a mobile dopant, such as phosphorous, in the source region, and then driving the dopant into the substrate such that it overlaps the gate. The dopant diffuses laterally as well as vertically, thus consuming space between gates of adjacent cells.

Trench transistors are often used in power-handling applications, such as DC—DC conversion, power switching, as in a computer power management circuitry, for example. Trench transistors often operate at 5–100 V, as compared to 2–5 V for a logic-type MOSFET. The gate of a trench transistor is made relatively "wide" to improve the current-handling capability of the trench transistor, and a heavy body 30 is formed to make the device more rugged and able to operate more effectively during switching.

Heavy body 30 is a relatively highly doped region of the same conductivity type as well 32 of the device. Heavy body 20 suppresses the parasitic bipolar transistor turn on between the collector and well region 32, which would result in an uncontrolled current flow (i.e. not controlled by the gate of the device), typically leading to cell or device failure. In a double-diffused (DMOS) trench FET, the effectiveness of the heavy body may be compromised if the source dopant (e.g., Phosphorus) compensates the heavy body dopant (e.g., Boron) resulting in lightly doped interface regions.

The section of the trench transistor shown in FIG. 1 is often referred to as a "cell", because it contains one portion of the gate that is typically repeated across the die. Trench transistor cells are typically laid-out in either a "grid" pattern, as shown in FIG. 2, forming a "closed cell" configuration, or a "stripe" pattern, as shown in FIG. 3, forming an "open cell" configuration. In either arrangement, the several cells of a single trench transistor are typically biased with a nominal $V_{GS}$ and a nominal $V_{DS}$ that are applied to each cell according to known methods.

Typically, the trench is filled with conductive material by conformally depositing the conductive material over the substrate, and then etching the conductive material off the surface of the substrate and into the trenches, leaving the conductive material in the trenches to form a gate structure. The conductive material is "overetched", that is, etched to a greater degree to completely remove any residue of the conductive material across the surface of the entire substrate. The degree of overetching is difficult to control accurately and can vary according to a number of parameters, such as the nominal thickness of the conductive material and the uniformity of the etch rate across the substrate. Referring again to FIG. 1, the depth of the top of gate 26 from the surface of substrate 28 can vary, as can the overlap 24 between the gate and the source.

Thus, it is desirable to provide a method that will produce a trench transistor with a large and effective heavy body and wherein the gate will reliably overlap the source region. It is further desirable to form the gate-source overlap in a controlled manner to result in devices with more consistent and superior performance characteristics.

SUMMARY OF THE INVENTION

The present invention provides a trench transistor with a source that is self-aligned to the gate. A self-aligned source is a source that has been implanted such that a gate material, which is in a trench and separated from the substrate by a gate dielectric layer, acts as an implantation mask during the source implantation step. A self-aligned source therefore has been at least partially implanted through a sidewall of the trench. In one embodiment a gate-source overlap results from an angled implantation step that implants source dopant beneath a portion of the gate. After implanting one edge of a trench, the substrate may be rotated 180 degrees to implant the other edge of the trench without breaking vacuum or removing the substrate from the ion implanter. The angled implant can provide a consistent, low gate-to-source capacitance, thus resulting in a more uniform and predictable device with lower parasitic capacitance than conventional devices. The angled implant also allows the gate-source overlap to be formed without relying on diffusing source dopant into the epi, which would otherwise compensate the heavy body dose and reduce the effectiveness of the heavy body. The angle of the implant can be varied to control the relative doping concentration between an active source region and a source contact region. In one embodiment, arsenic ("As") is implanted to form an n+ source region because of the relatively low diffusivity of As in silicon, thus forming an "L-shaped" source region with a distict interior corner that the heavy body can extend into to enhance ruggedness of the device.

Accordingly, in one embodiment, the present invention provides a trench transistor including a substrate having a surface; a trench extending a selected depth into the substrate from the surface, the trench having a sidewall; a gate structure at least partially within the trench; and a source region self-aligned to the gate.

In another embodiment, the present invention provides a method of forming a source region in a trench transistor, the method including the steps of: (a) forming a trench in a substrate, the substrate having a surface and the trench having a sidewall; (b) forming a gate structure in the trench; and (c) implanting source dopant such that at least a portion of the source dopant is implanted through the sidewall.

The following detailed description and the accompanying drawings provide a better understanding of the nature and advantages of the trench transistor with self-aligned source according to the present invention.

BRIEF DESCRIPTION OF THE DRAWINGS

FIG. 1 is a simplified cross section of a double-diffused trench metal-oxide-semiconductor field-effect transistor ("DMOS trench FET");

FIG. 2 is a simplified cut-away view illustrating a closed-cell gate configuration of a trench transistor;

FIG. 3 is a simplified cut-away view illustrating an open-cell gate configuration of a trench transistor;

DESCRIPTION OF THE PREFERRED EMBODIMENT

The present invention provides a trench transistor with a source region that is self-aligned to the gate. In one embodiment, a source implantation is performed at a non-orthogonal angle to the surface of the substrate, thus implanting source dopant beneath a portion of the gate. The corner of the gate acts as an implantation mask such that the overlap between the gate and the source can be controlled by the angle of implantation. The gate-source capacitance is consistent across the wafer, and is relatively low due to the small and predictable overlap of the gate and source. The self-aligned source also allows a smaller gate pitch, as the source regions take minimal area between the gates, and eliminates the need for a source drive-in, thus improving the efficiency of the heavy body implant dose.

I. EXEMPLARY DEVICE CROSS SECTION

Figure 4:
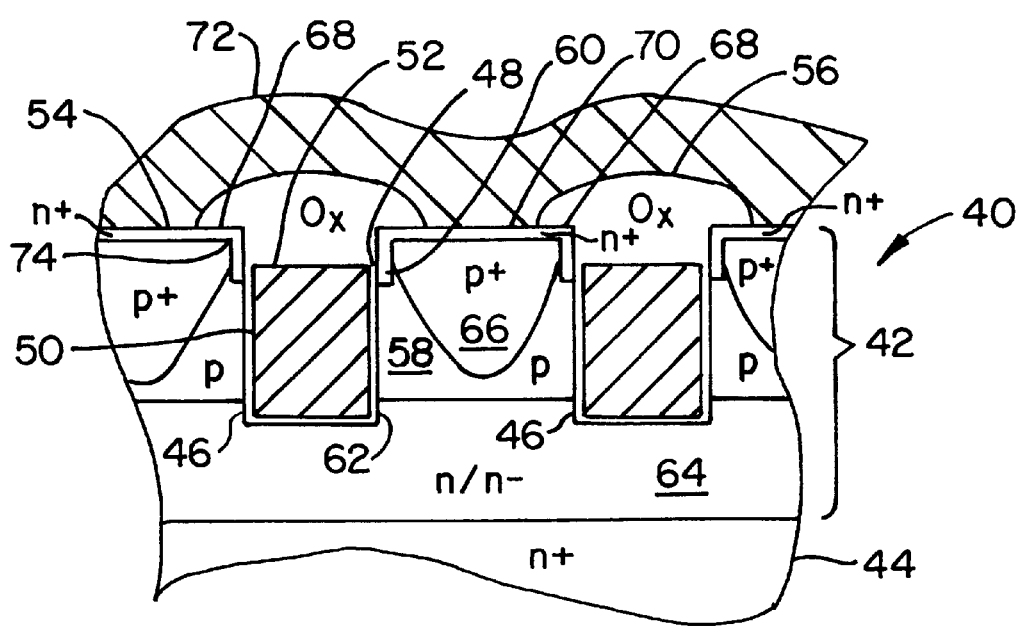
FIG. 4 is a simplified cross section of a trench transistor with a self-aligned source, according to one embodiment of the present invention.

FIG. 4 is a simplified cross section of a portion of an exemplary n-channel trench transistor 40 according to an embodiment of the present invention. The n-channel trench transistor is fabricated in an epitaxial layer 42 that was formed on an n+ single-crystal silicon wafer 44. Trenches 46 are formed in the epitaxial layer and a gate dielectric layer 48, such as thermal oxide, is formed to line the trench before filling the trench with a conductive material for the gate 50. The gate may be of doped polysilicon, for example. The top surface 52 of the polysilicon is recessed from the surface of the of the substrate 54 by an exemplary distance of about 0.5 $\mu$m. A dielectric layer 56 covers the trench opening and a portion of the silicon surface.

A well 58 of p-type semiconductor material is formed by implanting boron into the epitaxial layer, or by other means of doping or by forming a p-type epi layer over the n-type epi layer. During device operation, a channel is formed in the well region adjacent the gate, between the source region 60 and the drain region 62. A p+ heavy body 66 is formed in the well region for ruggedness and for good electrical contact to the body of the device, and an "L-shaped" n+ region 68 with an interior corner 74 is formed near the surface of the substrate and near the wall of the trench. The n+ region includes a source region 60 and a source contact region 70. The source contact region is electrically coupled to a source metal layer 72 that overlies a portion of the device and forms electrical connections between the source bias connection (not shown) and the source regions of the cells of the transistor.

The heavy body 66 preferably extends into the inner corners 74 of the L-shaped n+ region, which has an exemplary junction depth of about 0.15 $\mu$m from the surface of the epi, as compared to an exemplary junction depth of about 1 $\mu$m for the device shown in FIG. 1. It is understood that the n+ junction depth can be varied according to the source implant energy, and that the depth of the n+ region from the trench wall depends on the angle of implant. These dimensions are also slightly impacted by subsequent diffusion or drive-in. The extension of the heavy body into the inner corners of the n+ region increases the n+ source/p-well junction barrier in the bulk silicon (the silicon between adjacent gates) and minimizes bulk punch-through, thus reducing drain to source leakage current $I_{DSS}$.

The shallow n+ implant, and hence junction depth, also consumes less lateral distance in the bulk silicon, allowing the heavy body to be larger and more effective, and/or allowing a reduced gate pitch. The result is a cell that can be scaled down for better performance, and improved yield, without sacrificing the ruggedness of the device. For example, a cell pitch of approximately 1.3 $\mu$m may be made using 0.35 $\mu$m fabrication technology.

II. A PROCESS FOR FORMING A SELF-ALIGNED SOURCE

Figure 5:
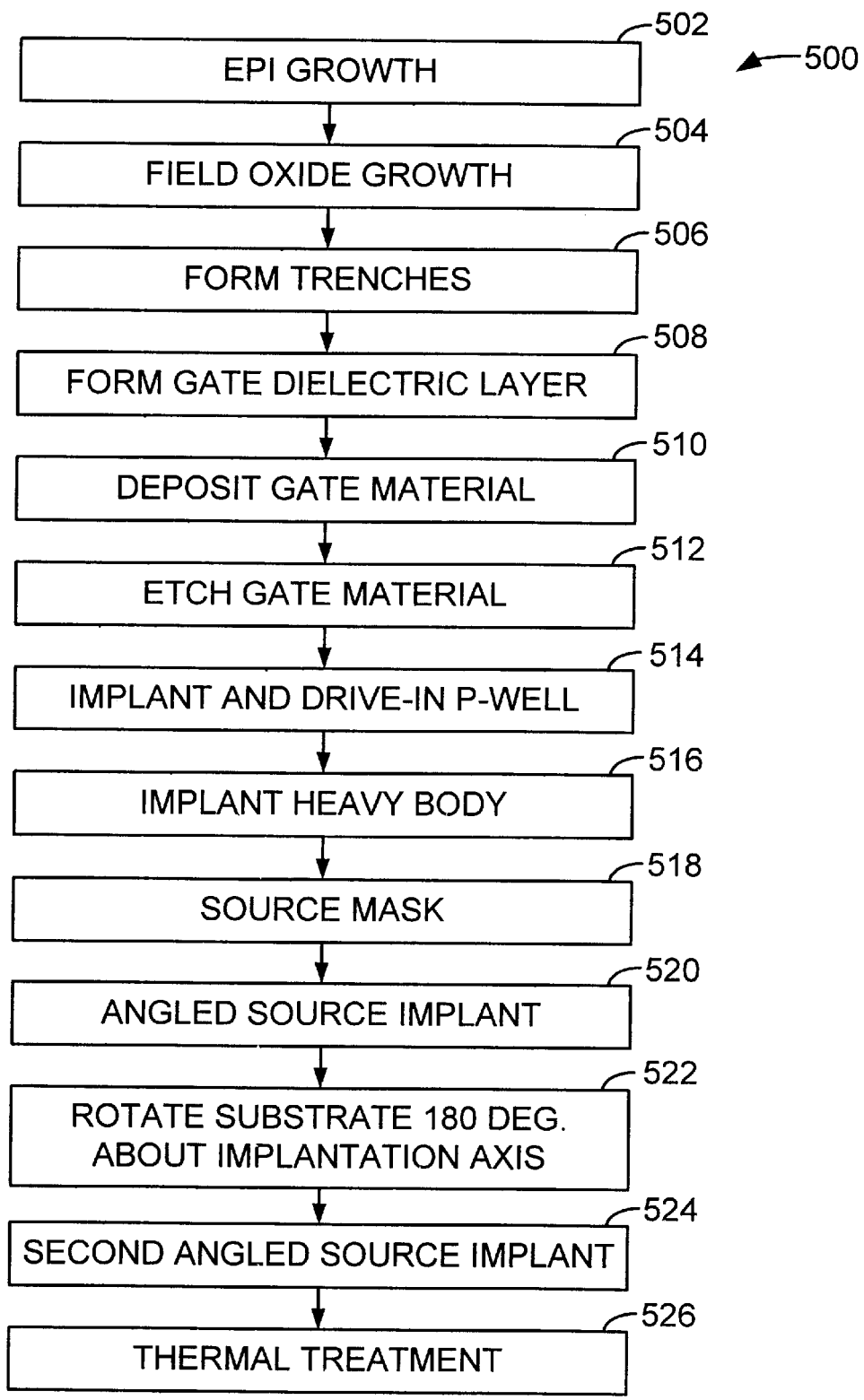
FIG. 5 is a simplified flow chart of a process for making a trench transistor with a self-aligned source, according to an embodiment of the present invention.

FIG. 5 is a flow diagram illustrating a simplified process 500 for fabricating the exemplary n-channel trench transistor with a self-aligned source according to an exemplary embodiment of the present invention. It is noted that some steps that are conventional or do not require illustration are described below but not shown in the figures. The order of some of the steps shown in FIG. 5 can be varied, and some steps may be optional.

An epitaxial layer is formed on a n++ single-crystal silicon wafer substrate (step 502). The substrate may be, for example, about 500 $\mu$m thick and may have an exemplary resistivity of between about 0.001–0.005 Ohm-cm. The epitaxial layer is, for example, about 4–20 $\mu$m thick and has an exemplary resistivity of about 0.1–6.0 Ohm-cm, selected at least partially on the intended operating voltage of the device. It is understood that the doping levels and types are given as examples, and that other doping levels or types of the substrate or epitaxial layer may be used, according to the type of device being fabricated. For example, in a dual-epi process (p-type epi over n-type epi, or vice versa), the first epitaxial layer might be thinner, or have a different doping concentration, as the well layer would not have to be formed by doping the first epi (drain) layer.

An oxide layer is formed on the surface of the epitaxial layer. The oxide layer may be, for example, about 5–10 kÅ thick. Next, the oxide layer is patterned and etched to define a mask, and a p-type dopant such as boron is implanted to form the p+ well field termination. An exemplary implant would be a dose of 1E14 (1×10$^{14}$) to 1E16 cm$^{-2}$ at an energy of from about 40–100 keV. The p+ dopant is then driven into the substrate by a thermal treatment and a field oxide layer from about 4–10 kÅ thick is formed over the p+ junction (step 504). Finally, the oxide over the active area of the substrate (the area where the cell array will be formed) is patterned and removed by any suitable etching process, leaving the field oxide only in desired areas.

A plurality of trenches are etched into the epitaxial layer of the substrate using photolithography and etch methods (step 506). After trench formation, a gate dielectric layer is formed on the trench walls (step 508). Preferably, the gate dielectric has a thickness from about 100–1000 Å.

Polysilicon is deposited to fill the trench and cover the surface of the substrate, generally to a thickness of from about 1 to 2 μm, depending on the trench dimensions. The polysilicon is then doped, such as in a POC13 process or by implanting phosphorus. It is understood that in-situ doped polysilicon, amorphous polysilicon, or other material, could be used for the gate.

The polysilicon layer is then removed from the surface of the substrate, such as by etching, leaving polysilicon in the trenches (step 512). If areas of polysilicon are desired on the surface of the substrate, such as for contact pads or a gate bus, those areas may be protected with patterned and developed photo resist prior to etching (not shown). Overetching is typically required to ensure that the polysilicon is completely removed from the surface of the substrate and recessed into the trench. This overetching results in the polysilicon in at least some of the trenches being recessed from the surface of the substrate. In a particular embodiment, the desired recess may be about 0.5 μm.

The p– well is formed (step 514) by implanting e.g., boron at an exemplary energy of 30 to 100 keV and an exemplary dosage of 1E13 to 1E15, and driving it in to a depth of from about 1 to 3 μm using conventional techniques. The p+ heavy body formation can be performed either before formation of the n+ source junction, or afterwards, but is preferably performed before the source junction formation for reasons discussed below. Alternatively to implanting the p– well, a p-type epi layer could be grown prior to trench formation.

To form the heavy body (step 516), a mask is formed over the areas that will not be doped p+. To accomplish this, preferably a double implant of boron is performed. For example, a double implant includes first boron implant at an energy of 150 to 200 keV and a dose of 1E15 to 5E15, and a second boron implant at an energy of 20 to 40 keV and a dose of 1E14 to 1E15, although other energies and doses may be appropriate depending on the desired depth, dopant profile, and compensation from the source doping process. The high energy first implant brings the p+ heavy body as deep as possible into the substrate, to reduce compensation of the n+ source junction. The second, lower energy/lower dose implant extends the p+ heavy body from the deep region formed during the first implant up to the substrate surface to provide the p+ contact. The resulting p+ heavy body/p-well junction is preferably about 0.4 to 1 μm deep at this stage of the process. The final junction depth after drive-in is preferably about 0.5 to 1.5 μm deep. It will be appreciated by those skilled in the art that the junction can be formed in many other ways, e.g., by diffused dopants or by using a continuous dopant source at the surface, for example.

The drive-in may be performed after the heavy-body implantation, or after the source implantation, or the drive-in may be split into two thermal treatments. Conventional source formation processes typically dope both the heavy body and the source regions, and then perform a single drive-in. However, it may be desirable to minimize the diffusion of an angled source implant, hence the heavy-body implantation may be driven in prior to the source implantation and only a brief thermal treatment to activate the implanted dopant is performed after the source implant.

After the formation of the p+ heavy body, a conventional resist strip process is performed to remove the mask, and a new mask is patterned (step 518) to prepare the substrate for the formation of the n+ source junction. This mask is a n+ blocking mask and is patterned to cover the areas of the substrate surface which are to provide p+ contacts. This results in a pattern of p+ and n+ contacts for well and source regions.

The n+ source regions and n+ contact are formed using a multiple implant process. Two implantations are used to process an open-cell structure, where the gates are essentially parallel, and four implantations are used to process a square closed-cell structure, where the gates form a grid pattern. Other implantation sequences may be appropriate for other device configurations. A sequence for an open-cell structure will be described, but it is understood that the method could be adapted to a closed-cell structure, or other type of trench transistor.

Figure 6A:
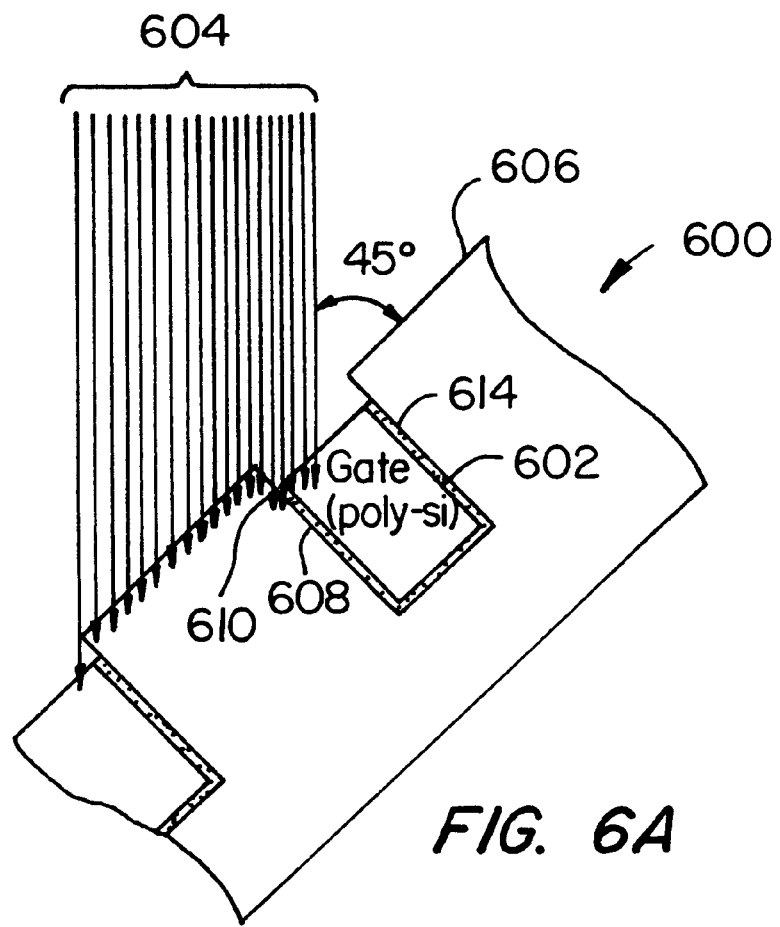
FIG. 6A is a simplified representation of implanting a self-aligned source region into the sidewall of a trench, beneath a gate structure.

FIG. 6A is a simplified cross-sectional view of an angled implant into a portion of a substrate 600 with trenched gates 602, according to an embodiment of the present invention. The ion beam, represented by arrows 604, impinges on the substrate at an angle of about 45 degrees, chosen for representative purposes only. Typically, a preferred angle for implantation is about 30 degrees from the surface of the epi layer. At such an angle, dopant species are implanted into the surface 606 of the substrate and the sidewall 608 of the trench in substantially equal proportions after the two implants resulting in similar doping concentrations, however, the depth and concentration of the dopants on the sidewall relative to the surface may be varied as desired by the angle of implantation, according to trigonometric and crystallographic principles. Some dopant is implanted into the sidewall "beneath" the gate polysilicon 610, so that an overlap of the gate and source regions will be formed. The thin gate dielectric 614 has a minor effect on the implantation depth, which is not shown for purposes of simplicity.

Figure 6B:
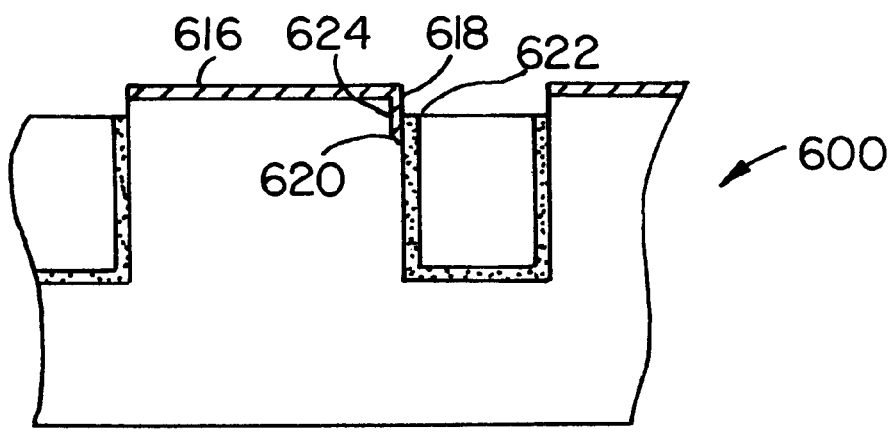
FIG. 6B is a simplified cross section of the source and source contact region after the implantation process of FIG. 6A.

FIG. 6B is a simplified cross section of the portion of substrate 600 after implantation showing a source contact region 616 and a source region 618. The source region has a slight taper 620 from the masking effect of the corner of the gate 622. An overlap 624 between the gate and the source region has been formed.

Figure 6C:
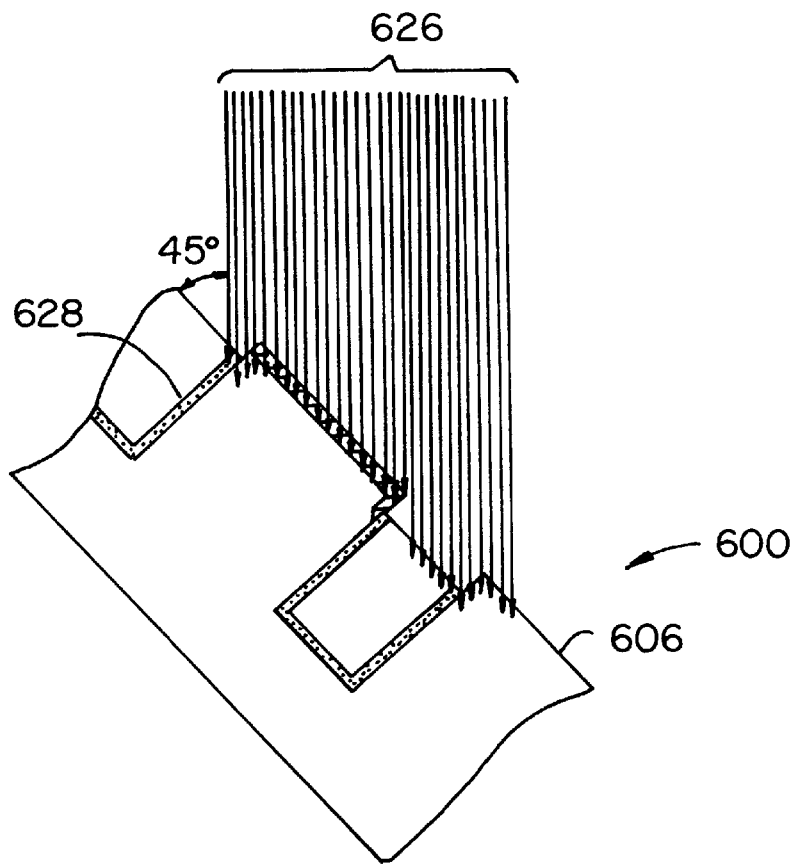
FIG. 6C is a simplified representation of a second implantation for forming a second source region into the opposite sidewall of the trench.

FIG. 6C is a simplified representation of a second angled implant into the portion of the substrate 600. A second ion beam, represented by arrows 626, impinges on the substrate at an angle of about 45 degrees. In this case, the angle is complimentary to the angle of the first source implant, so that the opposite sidewalls 628 that were not implanted in the first source implant will now be implanted. Note that the surface of the substrate 606 receives a second dose.

Figure 6D:
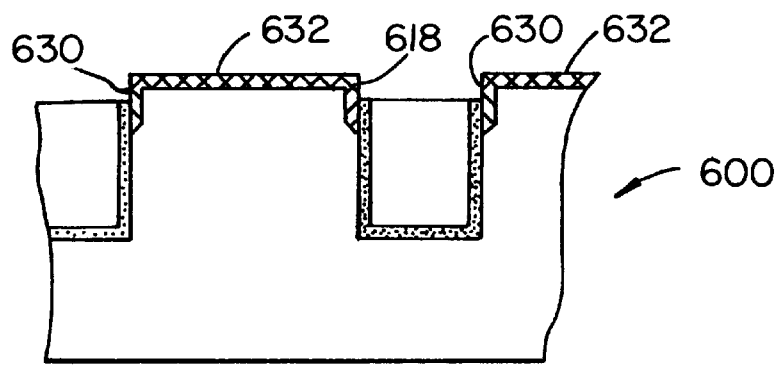
FIG. 6D is a simplified cross section of the sources and source contact region after both implantation processes, which are shown in FIGS. 6A and 6C.

FIG. 6D is a simplified cross section of the portion of the substrate 600 after the second source implant showing source regions 618, 630, and source contact regions 632. The single implant dose in the source regions is represented by slanted lines, while the double implant dose in the source contact regions is represented by cross hatching. At an angle of 45 degrees for both the first and second source implants, the dose in the source contact region will be about twice the dose on the sidewalls of the trenches, assuming the first and second implants have the same nominal dose. The nominal dose is the dose through a plane normal to the implant direction.

The relative concentration between the sidewall dose and the surface dose can be controlled by the angle of implantation. The angle of implantation is the angle between the implant direction and the surface of the substrate. If the angle is reduced (i.e., the substrate is tilted to a greater degree) relatively more dopant will be implanted into the sidewall. The desired angle of implantation and dose may be chosen according to the desired device characteristics.

Referring again to FIG. 5, a first implant (step 520) of arsenic is performed at an angle of 45 degrees at a nominal dose of 5.0E15 and an energy of 80 keV. The substrate does not have to be removed from the implanter, but may be rotated 90 degrees (step 522) about the direction of implantation to present a complimentary angle for the second implant (step 524). The second implant is also an arsenic implant at a nominal dose of 5.0E15 and an energy of 80 keV. Of course, additional implants may be appropriate for different trench transistor structures, such as a grid structure.

A thermal treatment (step 526) is performed to drive in and activate the arsenic and boron dopants that were implanted in the heavy body and source implantation steps. A short cycle is used, preferably at 900–950° C., or a rapid thermal pulse process, so that activation occurs without excessive diffusion. As discussed above, a thermal treatment may be performed after the heavy-body implantations and prior to the source implantations to drive in the boron, and a reduced thermal treatment after the source implantations may be used to activate the arsenic (or other source dopants) with a minimum of source dopant diffusion.

The substrate is then processed according to known methods. One example of such methods is found in U.S. patent application Ser. No. 08/970,221, by Mo et al, entitled FIELD EFFECT TRANSISTOR AND METHOD OF ITS MANUFACTURE, filed on Nov. 17, 1997 (Attorney Docket No. 17732-722600), which is hereby incorporated by reference for all purposes.

While the above is a complete description of specific embodiments of the present invention, various modifications, variations, and alternatives may be employed. For example, although arsenic is given as an example of an n-type dopant to be used in forming a self-aligned source for n-channel transistors, other slow diffusers or other n-type dopants, such as phosphorous, or even p-type dopants for p-channel transistors, such as boron, could be used, depending on the device structure and thermal processing. It is therefore understood that a trench transistors with a self-aligned source could be made as either an n-channel or p-channel device. Furthermore, it is understood that the choice of the dopant, implant angle, implant dose, and implant energy may be varied according to the desired electrical characteristics of the device and/or the physical attributes of the device. For example, although the gate dielectric has been described as an oxide, it may be other material, such as a nitride or oxy-nitride. Additionally, although an embodiment has been described in terms of a silicon wafer, other types of substrates, such as a silicon-germanium substrate, or a silicon carbide substrate, for example, could be used. Therefore, the scope of this invention should not be limited to the embodiments described, and should instead be defined by the following claims.

What is claimed is:

1. A method of forming a trench transistor, the method comprising:

a) forming a trench in a substrate, the substrate having a surface and the trench having a first sidewall and a second sidewall;

b) forming a gate structure in the trench;

c) implanting a first dose of dopants such that a portion of the first dose is implanted through the first sidewall, and a further portion of the first dose is implanted through the surface;

d) changing an orientation of the substrate by a predetermined number of degrees about an axis of implantation; and e) implanting a second dose of dopants such that a portion of the second dose is implanted through the second sidewall, and a further portion of the second dose is implanted through the surface.

2. The method of claim 1, wherein the step of implanting a first dose of dopants is performed at a first angle with respect to the direction of implantation.

3. The method of claim 2, wherein the substrate is tilted by the first angle prior to the step of implanting.

4. The method of claim 3, wherein the step of changing an orientation of the substrate comprises rotating the substrate by 180 degrees in a plane orthogonal to a direction of implantation.

5. The method of claim 3, wherein the step of changing an orientation of the substrate comprises tilting the substrate in the plane of incidence by a second angle in the opposite direction of the first angle.

6. The method of claim 5, wherein the second angle is twice the magnitude of the first angle.

7. The method of claim 6, wherein the second angle is 90 degrees.

8. The method of claim 1, wherein the dopants comprise slowly diffusing dopants.

9. The method of claim 8, wherein the dopant comprises arsenic.

10. The method of claim 1 wherein a relative concentration of a first sidewall dose and a surface dose is controlled by the first angle.

11. The method of claim 1 wherein a relative concentration of a second sidewall dose and the surface dose is controlled by the second angle.

12. A method of forming a trench transistor, the method comprising:

a) forming a trench in a substrate, the substrate having a surface and the trench having a first sidewall and a second sidewall;

b) forming a gate structure in the trench;

c) implanting a first dose of dopants such that a portion of the first dose is implanted through the first sidewall, and a further portion of the first dose is implanted through the surface;

d) changing an orientation of the substrate by a predetermined number of degrees about an axis of implantation; and e) implanting a second dose of dopants such that a portion of the second dose is implanted through the second sidewall, and a further portion of the second dose is implanted through the surface, wherein a substantially L-shaped n+ source is formed.

13. A method of forming a trench transistor, the method comprising:

growing an epitaxial layer on a semiconductor substrate;

growing a field oxide on the epitaxial layer;

forming at least one trench in the epitaxial layer, the at least one trench having;

a first sidewall, a second sidewall, and a bottom surface;

forming a gate dielectric layer inside the at least one trench;

depositing a gate material in the at least one trench;

etching the gate material to form a recess in the at least one trench;

implanting well-forming dopants into the epitaxial layer adjacent to the at least one trench;

driving-in the well-forming dopants to form a well region;

forming a heavy body region inside the well region;

forming a source mask;

angle implanting the first sidewall of the at least one trench and the surface of the epitaxial layer;

changing an orientation of the semiconductor substrate about an axis of implantation;

angle implanting the second sidewall of the at least one trench and the surface of the epitaxial layer; and performing a thermal treatment.

14. The method of claim 13 wherein the step of changing an orientation of the semiconductor substrate comprises rotating the substrate 180 degrees about an axis of implantation.

* * * * *

UNITED STATES PATENT AND TRADEMARK OFFICE
CERTIFICATE OF CORRECTION

PATENT NO. : 6,583,010 B2
DATED : June 24, 2003
INVENTOR(S) : Mo

It is certified that error appears in the above-identified patent and that said Letters Patent is hereby corrected as shown below:

<u>Title page,</u>
Item [57], ABSTRACT,
Line 14, "90 degrees" should be -- 180 degrees --

<u>Column 7,</u>
Line 1, "90 degrees" should be -- 180 degrees --

Signed and Sealed this

Twenty-third Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,583,010 B2  Page 1 of 1
APPLICATION NO. : 09/839523
DATED : June 24, 2003
INVENTOR(S) : Mo It is certified that error appears in the above-identified patent and that said Letters Patent is hereby corrected as shown below:

<u>Title page,</u>
Item [57], ABSTRACT,
Line 4, "implanting an" should be --implanting at--

Line 14, "180 degrees" (as recited by the Certificate of Correction issued March 23, 2004) should be --90 degrees-- (as recited by the issued patent)

<u>Column 2,</u>
Line 28, "180 degrees" should be --90 degrees--

<u>Column 7,</u>
Line 1, "180 degrees" (as recited by the Certificate of Correction issued March 23, 2004) should be --90 degrees-- (as recited by the issued patent)

<u>FIG. 5,</u>
Step 522, "180 DEG." should be --90 DEG.--

Signed and Sealed this

Twenty-seventh Day of March, 2007

JON W. DUDAS
*Director of the United States Patent and Trademark Office*